(12) United States Patent
Do (10) Patent No.: US 8,330,531 B2
(45) Date of Patent: *Dec. 11, 2012

(54) INTERNAL NEGATIVE VOLTAGE GENERATION DEVICE

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/409,379

(22) Filed: Mar. 1, 2012

(65) Prior Publication Data

US 2012/0154024 A1 Jun. 21, 2012

Related U.S. Application Data

(63) Continuation of application No. 12/648,439, filed on Dec. 29, 2009, now Pat. No. 8,143,937.

(30) Foreign Application Priority Data

Dec. 14, 2009 (KR) .......................... 10-2009-0124120

(51) Int. Cl.
*G05F 1/10* (2006.01)
*G05F 3/02* (2006.01)

(52) U.S. Cl. ....................................................... 327/536
(58) Field of Classification Search .................. 327/536; 365/189.09; 363/59–60
See application file for complete search history.

(56) References Cited

U.S. PATENT DOCUMENTS

| 6,335,893 B1 * | 1/2002 | Tanaka et al. ................. 365/226 |
| 7,983,098 B2 * | 7/2011 | Passerini et al. .......... 365/189.11 |
| 2003/0058692 A1 * | 3/2003 | Shiga ......................... 365/189.09 |
| 2005/0073355 A1 * | 4/2005 | Sivero et al. .................. 327/536 |
| 2008/0157856 A1 * | 7/2008 | Lee .............................. 327/536 |

* cited by examiner

*Primary Examiner* — Quan Tra
(74) *Attorney, Agent, or Firm* — IP & T Group LLP (57) ABSTRACT

An internal negative voltage generation device includes a first internal negative voltage generation block configured to generate a first internal negative voltage which is lower than a ground voltage; a second internal negative voltage generation block configured to generate a second internal negative voltage according to the first internal negative voltage, the second internal negative voltage being higher than the first internal negative voltage and lower than the ground voltage; and an initial driving block configured to additionally drive a second internal negative voltage terminal to the first internal negative voltage during an initial set time interval of an active operation time interval.

14 Claims, 7 Drawing Sheets

FIG. 8

INTERNAL NEGATIVE VOLTAGE GENERATION DEVICE

CROSS-REFERENCE TO RELATED APPLICATIONS

This application is a continuation of U.S. patent application Ser. No. 12/648,439 filed on Dec. 29, 2009, now U.S. Pat. No. 8,143,937 which claims priority of Korean Patent Application No. 10-2009-0124120, filed on Dec. 14, 2009. The disclosure of each of the foregoing applications is incorporated herein by reference in its entirety.

BACKGROUND OF THE INVENTION

Exemplary embodiments of the present invention relate to a semiconductor memory device, and more particularly, to an internal negative voltage generation device of a semiconductor memory device.

In general, a semiconductor memory device includes a large number of memory cells as basic units, which form a matrix-shaped array. Each memory cell of a Dynamic Random Access Memory (DRAM), which is a representative semiconductor memory device, includes one NMOS transistor and one capacitor. In the memory cell of a DRAM, a loss of data stored in the memory cell occurs due to a variety of leakage factors. The leakage factors may include off leakage which causes a data loss even when a memory cell is not selected.

To prevent such a data loss caused by the leakage, a DRAM performs a refresh operation to amplify and restore data at set time intervals.

To reduce the off leakage of the memory cell, the threshold voltage of a memory cell transistor may be increased. In this case, however, a time period required for storing data in the memory cell may increase.

Accordingly, a negative word line scheme has been adopted, which may improve a refresh characteristic without increasing a time period required for storing data in a memory cell.

In the negative word line scheme, the level of a voltage supplied to a word line in a precharge state in which a word line is not selected is maintained at a negative level lower than that of a ground voltage VSS. Therefore, it is possible to regulate the off leakage using a gate-source voltage relationship without increasing the threshold voltage of a memory cell transistor.

Figure 1:
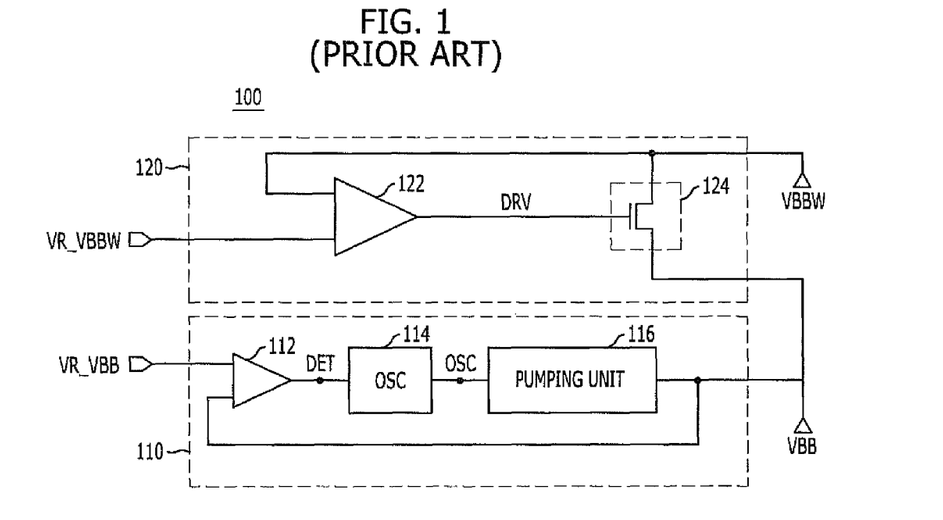
FIG. 1 is a block diagram of a conventional internal negative voltage generation device.

FIG. 1 illustrates a conventional regulator-type internal negative voltage generation device.

Referring to FIG. 1, the negative interval voltage generation device 100 includes a back-bias voltage generation block 110 and a negative word line driving voltage generation block 120. The back-bias voltage generation block 110 is configured to generate a back-bias voltage VBB which is lower than a ground voltage. The negative word line driving voltage generation block 120 is configured to generate a negative word line driving voltage VBBW having a voltage level between the ground voltage and the back-bias voltage VBB through a regulating operation.

The back-bias voltage generation block 110 includes a voltage detection unit 112, an oscillating unit 114, and a pumping unit 116. The voltage detection unit 112 is configured to compare a first reference voltage VR_VBB with a fed-back voltage of the back-bias voltage VBB and to output a detection signal DET as the comparison result. The first reference voltage VR_VBB corresponds to a target voltage level of the back-bias voltage VBB. The oscillating unit 114 is configured to generate and output an oscillation signal OSC at a corresponding frequency in response to the detection signal DET outputted by the voltage detection unit 112. The pumping unit 116 is configured to perform a pumping operation in response to the oscillation signal OSC outputted from the oscillating unit 114 and to generate the back-bias voltage VBB in accordance with the pumping operation. The pumping unit 116 may be implemented as a negative charge pump.

The negative word line driving voltage generation block 120 includes a voltage comparison unit 122 and a driving unit 124. The voltage comparison unit 122 is configured to compare a second reference voltage VR_VBBW and a fed-back voltage of the negative word line driving voltage VBBW, and to generate and output a driving control signal DRV corresponding to a comparison result. The second reference voltage VR_VBBW corresponds to a target voltage level of the negative word line driving voltage VBBW. The driving block 124 is configured to generate a negative word line driving voltage VBBW in response to the driving control signal DRV outputted by the voltage comparison unit 122. The driving unit 124 is implemented as an NMOS transistor coupled between a back-bias voltage (VBB) terminal and a negative word line driving voltage (VBBW) terminal, the NMOS transistor receiving the driving control signal DRV outputted by the voltage comparison unit 122 through a gate thereof.

The regulator-type internal negative voltage generation device 100 configured in such a manner has the following problem.

The negative word line driving voltage VBBW generated by the negative word line generation device 110 is supplied to an NMOS transistor of a memory cell through a word line driver. The word line driver and the NMOS transistor of the memory cell are not illustrated in the drawing. The negative word line driving voltage VBBW is varied by the consumption of dynamic power when the NMOS transistor of the memory cell is turned on/off by the word line driver. In other words, when the output signal of the word line driver changes its logic level, that is, when the output signal is 'activated', the negative word line driving voltage VBBW is changed. In this case, the changing negative word line driving voltage VBBW is supplied to a word line which does not change its logic level, that is, which is 'deactivated'. As a result, the data maintenance ability of the corresponding memory cell is degraded.

Furthermore, a plurality of comparators and a plurality of drivers may be distributed and arranged to generate a stable negative word line driving voltage VBBW. Since the plurality of comparators may have different characteristics, this may also act as a factor which causes variations in the negative word line driving voltage VBBW.

SUMMARY OF THE INVENTION

An embodiment of the present invention is directed to an internal negative voltage generation device to constantly maintain an internal negative voltage supplied to a word line to improve a data maintenance ability of a memory cell.

In accordance with an embodiment of the present invention, an internal negative voltage generation device includes: a first internal negative voltage generation block configured to generate a first internal negative voltage lower than a ground voltage; a second internal negative voltage generation block configured to generate a second internal negative voltage according to the first internal negative voltage, the second internal negative voltage being higher than the first internal negative voltage and lower than the ground voltage; and an initial driving block configured to additionally drive a second internal negative voltage terminal to the first internal negative voltage during an initial set time interval of an active operation time interval.

In accordance with another embodiment of the present invention, an internal negative voltage generation device includes: a first internal negative voltage generation block configured to generate a first internal negative voltage lower than a ground voltage; a second internal negative voltage generation block configured to generate a second internal negative voltage according to the first internal negative voltage, the second internal negative voltage being higher than the first internal negative voltage and lower than the ground voltage; and an initial driving block configured to detect a level of the second internal negative voltage at an initial stage of an active operation time interval, and to additionally drive a second internal negative voltage terminal to the first internal negative voltage during a time interval corresponding to a detection result.

In accordance with yet another embodiment of the present invention, an internal negative voltage generation device includes: a first internal negative voltage generation block configured to generate a first internal negative voltage lower than a ground voltage; a second internal negative voltage generation block configured to generate a second internal negative voltage according to the first internal negative voltage, the second internal negative voltage being higher than the first internal negative voltage and lower than the ground voltage; and an initial driving block configured to additionally drive a second internal negative voltage terminal to the first internal negative voltage during a first initial set time interval of a word line enable time interval and during a second initial set time interval of a word line disable time interval.

In accordance with still another embodiment of the present invention, an internal negative voltage generation device includes: a internal negative voltage generation block configured to use a first internal negative voltage lower than a ground voltage to generate a second internal negative voltage based on the ground voltage, the second internal negative voltage having a level higher than the first negative voltage and lower than the ground voltage; and an auxiliary driving block configured to additionally drive a second internal negative voltage terminal to the first internal negative voltage in response to an active signal during a set time interval.

DESCRIPTION OF SPECIFIC EMBODIMENTS

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
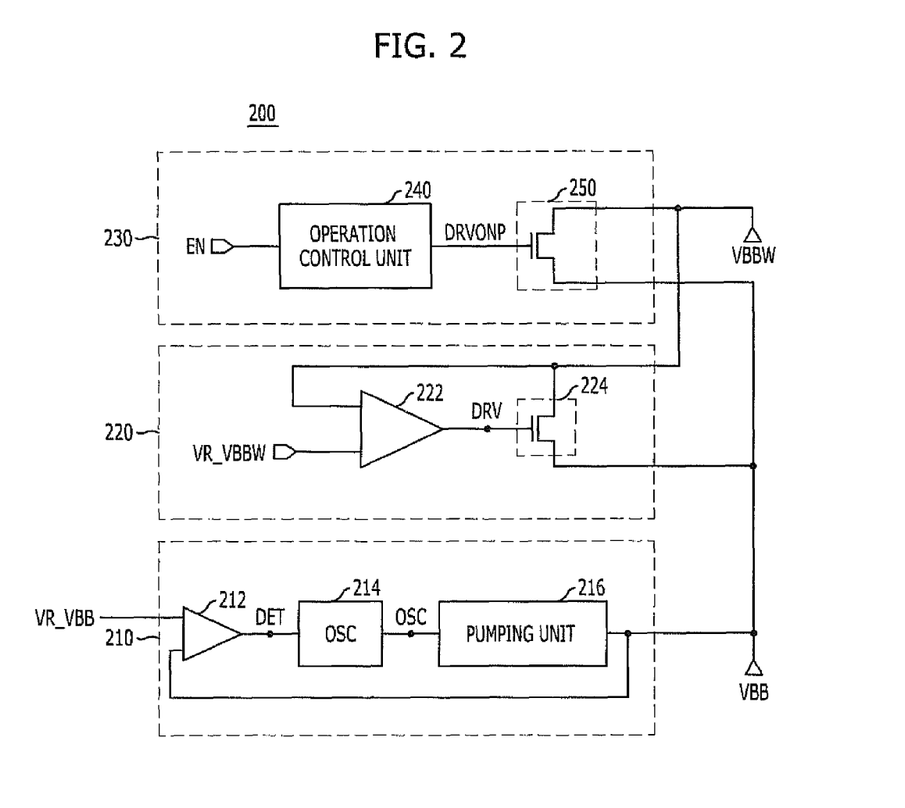
FIG. 2 is a block diagram of an internal negative voltage generation device in accordance with a first embodiment of the present invention.

FIG. 2 is a block diagram of an internal negative voltage generation device in accordance with a first embodiment of the present invention.

Referring to FIG. 2, the internal negative voltage generation device 200 includes a back-bias voltage generation block 210, a negative word line driving voltage generation block 220, and an initial driving block 230. The back-bias voltage generation block 210 is configured to generate a back-bias voltage VBB which is lower than a ground voltage. The negative word line driving voltage generation block 220 is configured to generate a negative word line driving voltage VBBW having a voltage level between the ground voltage and the back-bias voltage VBB, according to the back-bias voltage VBB generated by the back-bias generation block 210. The initial driving block 230 is configured to additionally drive a negative word line driving voltage (VBBW) terminal to the back-bias voltage VBB during an initial set time interval of an active operation time interval. The initial set time interval of the active operation time interval refers to an initial set time interval during which a word line is enabled.

The back-bias voltage generation block 210 includes a voltage detection unit 212, an oscillating unit 214, and a pumping unit 216. The voltage detection unit 212 is configured to compare a first reference voltage VR_VBB with the fed-back back-bias voltage VBB and to generate a comparison result as a detection signal DET. The first reference voltage VR_VBB corresponds to a target voltage level of the back-bias voltage VBB. The oscillating unit 214 is configured to generate and output an oscillation signal OSC at a corresponding frequency in response to the detection signal DET outputted by the voltage detection unit 212. The pumping unit 216 is configured to perform a pumping operation in response to the oscillation signal outputted by the oscillating unit 214, and to generate a back-bias voltage VBB in accordance with the pumping operation. The pumping unit 216 is implemented as a negative charge pump.

The negative word line driving voltage generation block 220 includes a voltage comparison unit 222 and a first driving unit 224. The voltage comparison unit 222 is configured to compare a second reference voltage VR_VBBW with the fed-back voltage of the negative word line driving voltage VBBW, and to generate and output a driving control signal DRV corresponding to a comparison result. The second reference voltage VR_VBBW corresponds to a target voltage level of the negative word line driving voltage VBBW. The first driving unit 224 is configured to generate the negative word line driving voltage VBBW in response to the driving control signal DRV outputted by the voltage comparison unit 222. The first driving unit 224 is implemented as an NMOS transistor coupled between a back-bias voltage (VBB) terminal and the negative word line driving voltage (VBBW) terminal, the NMOS transistor receiving the driving control signal DRV outputted by the voltage comparison unit 222 through a gate thereof.

The initial driving block 230 includes an operation control unit 240 and a second driving unit 250. The first operation control unit 240 is configured to receive an active initial operation signal, that is, a word line enable signal EN to output an operation control pulse signal DRVONP during a set time interval. The word line enable signal EN is a signal which is output when the corresponding word line is enabled. The word line enable signal EN is output in response to an active command, a precharge command, an auto refresh command, or the like. The second driving unit 250 is configured to drive the negative word line driving (VBBW) terminal to the back-bias voltage VBB during a set time interval in response to the operation control pulse signal DRVONP output by the operation control unit 240. The second driving unit 250 is implemented as an NMOS transistor coupled between the back-bias voltage (VBB) terminal and the negative word line driving voltage (VBBW) terminal, the NMOS transistor receiving the outputted operation control pulse signal DRVONP through a gate thereof.

Figure 3:
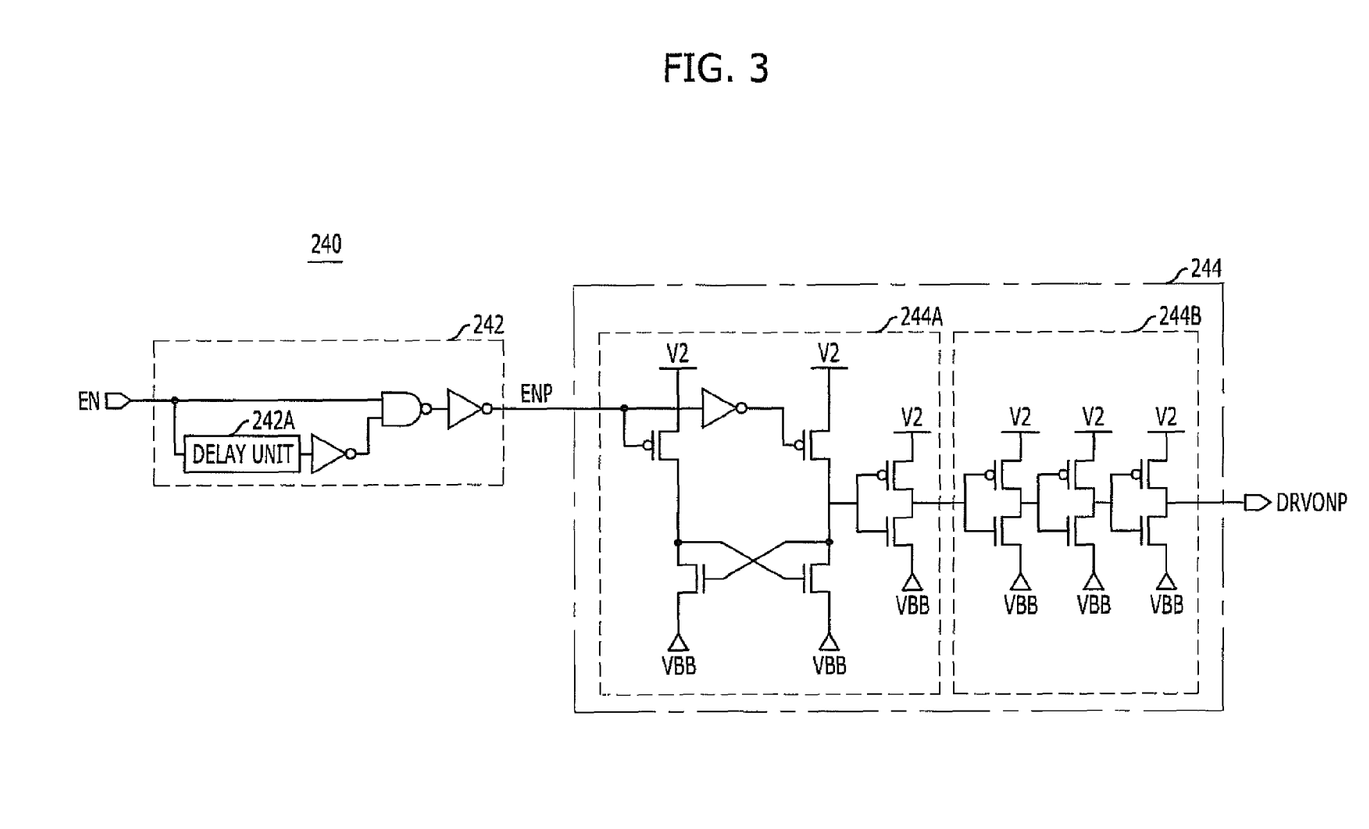
FIG. 3 is an internal circuit diagram of an operation control unit of FIG. 2.

FIG. 3 is an internal circuit diagram of the operation control unit 240.

Referring to FIG. 3, the operation control unit 240 includes an operation interval setting section 242 and a signal conversion section 244. The operation interval setting section 242 is configured to output an enable pulse signal ENP corresponding to a time interval in which the second driving unit 250 operates in response to the word line enable signal EN. The signal conversion section 244 is configured to convert the enable pulse signal ENP outputted by the operation interval setting section 242 into the operation control pulse signal DRVONP having a voltage level for operating the second driving section 250.

The operation interval setting section 242 includes a delay unit 242A configured to delay the outputted word line enable signal EN.

Although not shown in detail, a propagation delay circuit in which a logic gate, a resistor, and a capacitor are combined to transfer a signal may be used as the delay unit 242A. A delay time interval may be set through a test mode or fuse programming.

The signal conversion section 244 includes a voltage level shifter 244A and a buffer 244B. The voltage level shifter 244A is configured to shift the voltage level of the enable pulse signal ENP outputted by the operation interval setting section 242. The buffer 244B is configured to buffer an output signal of the voltage level shifter 244A. The voltage level shifter 244A and the buffer 244B are configured to output the operation control pulse signal DRVONP to have the same voltage level as the back-bias voltage VBB when the second driving unit 250 is turned off in response to the operation control pulse signal DRVONP, and to have a source voltage level V2 for a pull-up operation when the second driving unit 250 is turned on in response to the operation control pulse signal DRVONP.

Hereafter, an operation of the internal negative voltage generation device in accordance with the first embodiment of the present invention is described in detail with reference to FIG. 4.

Figure 4:
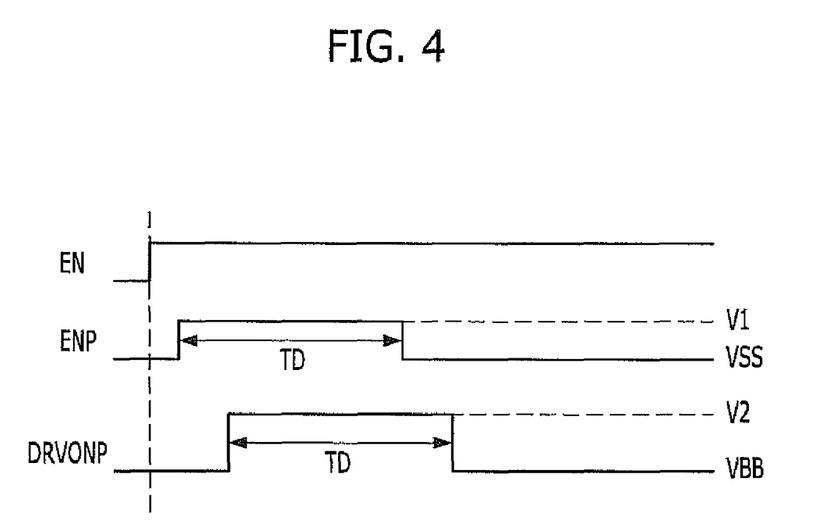
FIG. 4 is a timing diagram illustrating an operation of the internal negative voltage generation device of FIG. 2.

FIG. 4 is a timing diagram illustrating an operation of the internal negative voltage generation device of FIG. 2.

Referring to FIG. 4, the internal negative voltage generation device 200 generates a negative word line driving voltage VBBW through the back-bias voltage generation block 220 and the negative word line driving voltage generation block 230, and supplies the generated negative word line driving voltage VBBW to a word line driver which is not illustrated in the drawings.

The word line driver supplies the negative word lines driving voltage VBBW output by the internal negative voltage generation device 200 to a word line when the word line is disabled, in order to maintain data stored in the corresponding memory cell.

When data is read from or written into the corresponding memory cell, the corresponding word line is enabled. The corresponding word line driver changes the level of the negative word line driving voltage VBBW to the level of a high potential voltage VPP, and outputs the changed negative word line driving voltage VBBW to the word line.

At this time, the word line enable signal EN is output. The initial driving block 230 of the internal negative voltage generation device 200 additionally operates in response to the outputted word line enable signal EN.

Specifically, the operation time interval setting section 242 of the operation control unit 240 generates and outputs an enable pulse signal ENP corresponding to a set time interval, that is, a time interval in which the second driving unit 250 operates. At this time, the enable pulse signal ENP has a voltage level 'V1'.

Then, the voltage level shifter 244A shifts the voltage level of the enable pulse signal ENP outputted by the operation time interval setting section 242, and the buffer 244B buffers the output signal shifted by the voltage level shifter 244A to output an operation control pulse signal DRVONP having a source voltage level V2 for turning on the second driving unit 250.

In response to the supplied operation control pulse signal DRVONP, the second driving unit 250 is operated to supply a stable negative word line driving voltage VBBW to the word line driver during an initial activation time interval TD of the word line.

An internal negative voltage generation device in accordance with a second embodiment of the present invention is described as follows.

In the internal negative voltage generation device in accordance with the second embodiment of the present invention, a voltage detection section is additionally provided to detect a variation of the negative word line driving voltage VBBW, as compared with the first embodiment of the present invention. Therefore, the operation interval of the initial driving block may be more finely controlled. In the second embodiment of the present invention, only the operation control unit of the initial driving block has a different configuration from that of the first embodiment of the present invention. Accordingly, the following descriptions will be focused on the operation control unit. Furthermore, like reference numerals denote the same components as those of the first embodiment, and different reference numerals denote different components from those of the first embodiment. For convenience of explanation, the descriptions of the same components as those of the first embodiment have been omitted.

Figure 5:
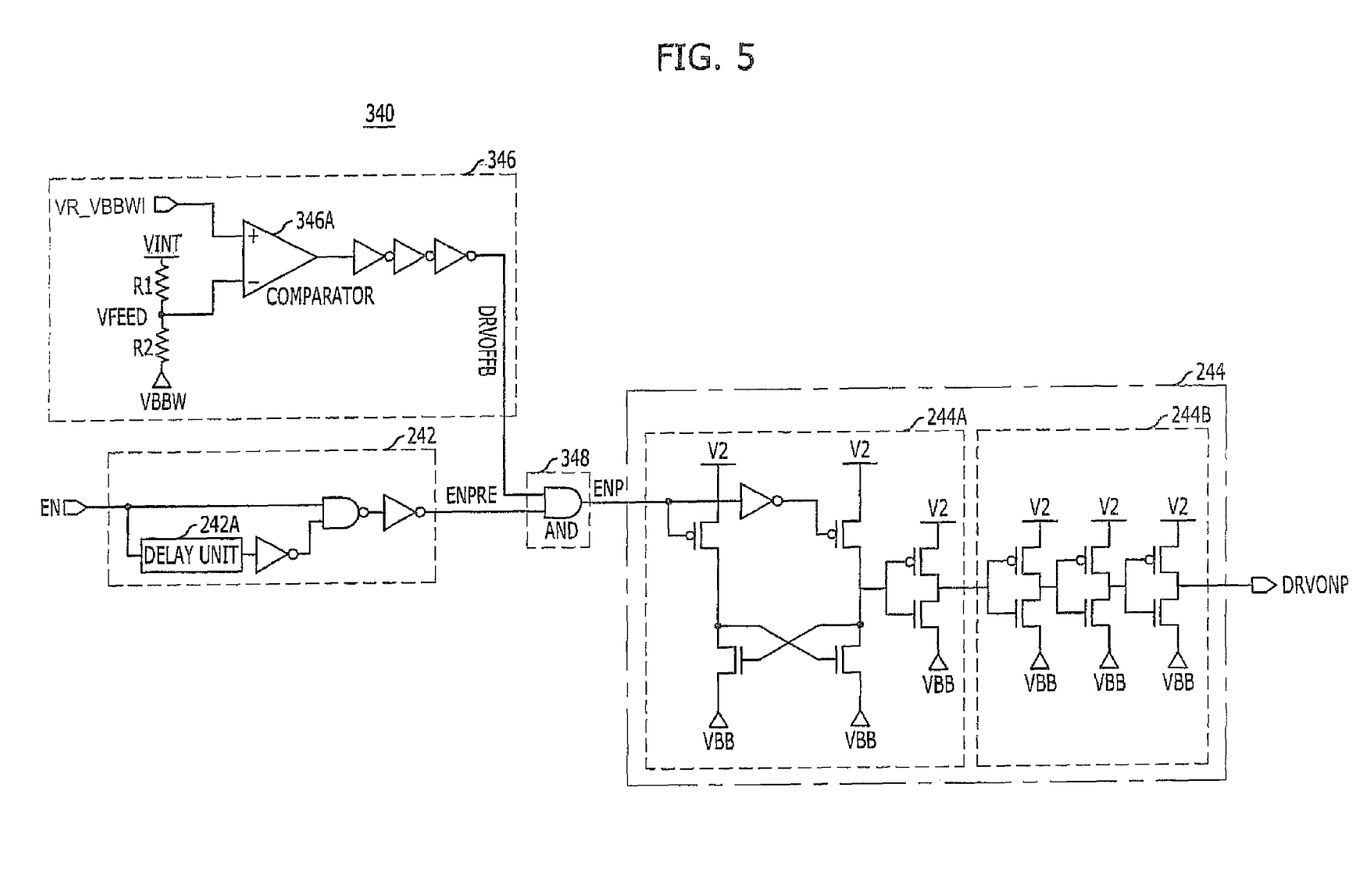
FIG. 5 is an internal circuit diagram of an operation control unit of an internal negative voltage generation device in accordance with a second embodiment of the present invention.

FIG. 5 is an internal circuit diagram of the operation control unit of the internal negative voltage generation device in accordance with the second embodiment of the present invention.

Referring to FIG. 5, the operation control unit 340 includes a voltage detection section 346 configured to detect whether or not the voltage level of the negative word line driving voltage VBBW has changed. The voltage detection section 346 is implemented as a comparator 346A configured to compare a third reference voltage VR_VBBW1 with a fed-back voltage VFEED of the negative word line driving voltage VBBW and to output a comparison result as a detection signal DRVOFFB. A noninverting terminal (+) of the comparator 346A receives the third reference voltage VR_VBBW1, and an inverting terminal (−) thereof receives the feedback voltage VFEED having a voltage level between a set time interval voltage VINT and the word line driving voltage VBBW. The third reference voltage VR_VBBW1 corresponds to a target voltage level of the feedback voltage VFEED. That is, the relationship between the third reference voltage VR_VBBW1 and the feedback voltage VFEED may be expressed as Equations 1 and 2 below.

$$VFEED = VR\_VBBW1 \qquad \text{Eq. 1}$$

$$\frac{VINT - VBBW}{R1 + R2} = \frac{VINT - VFEED}{R1} \qquad \text{Eq. 2}$$

The third reference voltage VR_VBBW1 and the feedback voltage VFEED may be set in various manners, if necessary.

The operation control unit 340 further includes a logic operation section 348 configured to logically operate upon the detection signal DRVOFFB output by the voltage detection section 346 and an output signal ENPRE output by the operation interval setting section 242, and to generate and output an enable pulse signal ENP. The logic operation section 348 is implemented as an AND gate.

Hereafter, an operation of the internal negative voltage generation device in accordance with the second embodiment of the present invention is described in detail.

Figure 6A:
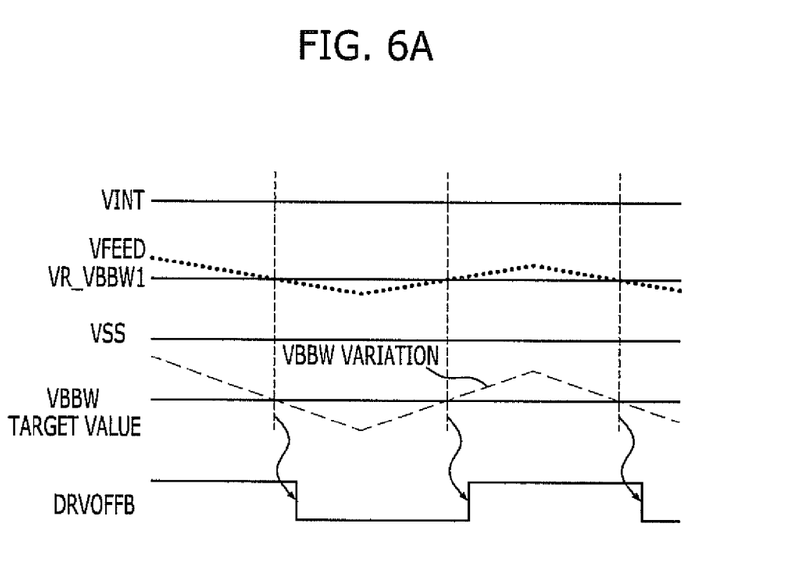
FIG. 6A is a timing diagram explaining an operation of a voltage detection section of FIG. 5.
Figure 6B:
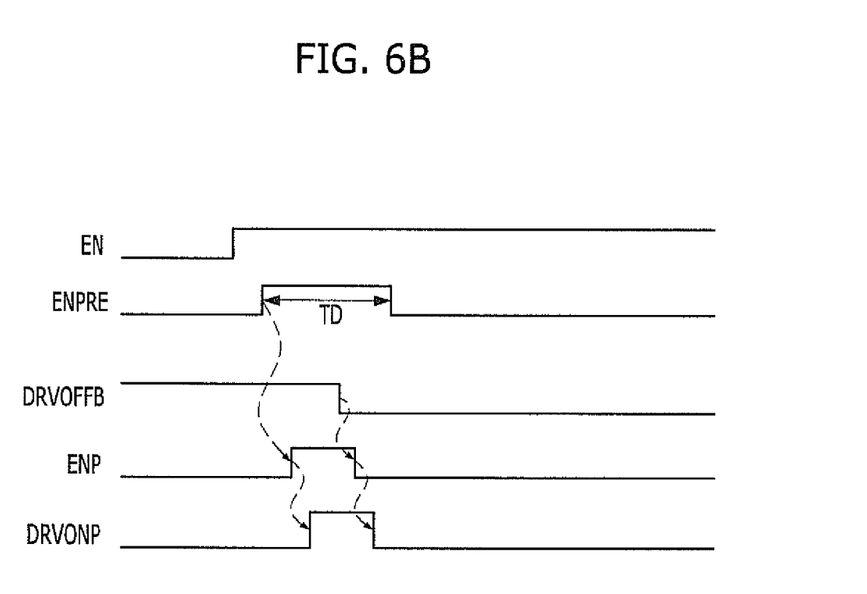
FIG. 6B is a timing diagram explaining an operation of the internal negative voltage generation device of FIG. 5.

FIG. 6A is a timing diagram explaining an operation of the voltage detection section of FIG. 5, and FIG. 6B is a timing diagram explaining an operation of the internal negative voltage generation device in accordance with the second embodiment of the present invention.

Referring to FIG. 6A, when a change in the voltage level of the negative word line driving voltage VBBW occurs, the feedback voltage VFEED also changes. Then, the voltage detection section 346 detects the changes. As a detection result, when the feedback voltage VFEED is greater than or equal to the third reference voltage VR_VBBW1, the voltage detection section 346 outputs the detection signal DRVOFFB.

Based on the outputted detection signal DRVOFFB of the voltage detection section 346, an operation in which a second internal negative voltage is constantly maintained is described as follows.

Referring to FIG. 6B, the negative word line driving voltage VBBW is supplied to a word line through a word line driver when the word line is disabled, in order to maintain data stored in the corresponding memory cell.

When data is read from or written into the corresponding memory cell, the corresponding word line is enabled. That is, the corresponding word line driver changes the level of the negative word line driving voltage VBBW to the level of a high potential voltage VPP, and supplies the changed negative word line driving voltage VBBW to the word line.

At this time, the word line enable signal EN is output. The initial driving block 230 is operated in response to the outputted word line enable signal EN.

Specifically, the operation interval setting section 242 generates and outputs a pulse signal ENPRE corresponding to a set time interval, that is, a set time interval in which the second driving unit 250 operates. The voltage detection section 346 receives the fed-back negative word line driving voltage VBBW to detect whether or not the voltage level of the negative word line driving voltage VBBW has changed, and activates the detection signal DRVOFFB depending on the detection result (refer to FIG. 6A).

Then, the logic operation section 348 receives the pulse signal ENPRE of the operation setting section 242 and the detection signal DRVOFFB of the voltage detection section 346 and logically multiplies the signals and outputs an enable pulse signal ENP. That is, the enable pulse signal ENP is output in response to the detection signal DRVOFFB.

The voltage level shifter 244A shifts the voltage level of the enable pulse signal ENP outputted by the logic operation section 348, and the buffer 244B buffers the output signal shifted by the voltage level shifter 244A to output an operation control pulse signal DRVONP having a source voltage level V2 for turning on the second driving unit 250.

Accordingly, the second driving unit 250 is operated in response to the supplied operation control pulse signal DRVONP. Since the operation time interval of the second driving unit 250 is determined on the basis of the voltage level of the negative word line driving voltage VBBW, the operation time interval of the second driving unit 250 may be controlled more minutely.

Hereafter, an operation of an internal negative voltage generation device in accordance with a third embodiment of the present invention is described.

In the third embodiment of the present invention, the initial driving block may be additionally operated even when the word line is disabled as well as when the word line is enabled, as compared with the first embodiment of the present invention. Therefore, the following descriptions are focused on the operation control unit of the initial driving block which has a different configuration from that of the first embodiment, as in the second embodiment of the present invention. Furthermore, like reference numerals denote the same components as those of the first embodiment of the present invention, and different reference numerals denote different components from those of the first embodiment of the present invention. For convenience of explanation, the descriptions of the same components as those of the first embodiment have been omitted.

Figure 7:
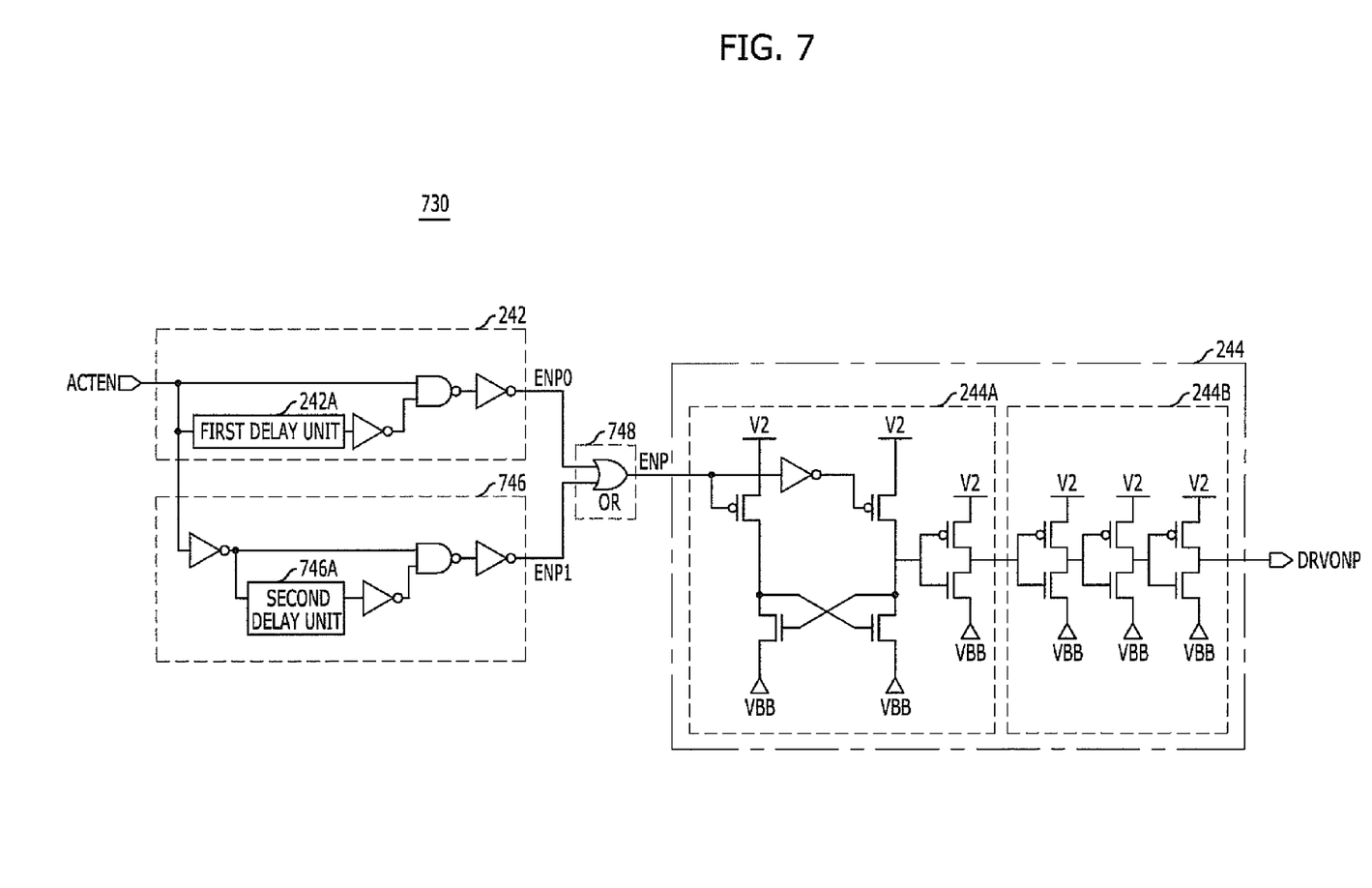
FIG. 7 is an internal circuit diagram of an operation control unit of an internal negative voltage generation device in accordance with a third embodiment of the present invention.

FIG. 7 is an internal circuit diagram of the operation control unit of the internal negative voltage generation device in accordance with the third embodiment of the present invention.

Referring to FIG. 7, the operation control unit 730 includes first and second operation interval setting sections 242 and 746 configured to set an operation time interval of the second driving unit 250 in response to a word line enable/disable signal ACTEN.

As described above with regard to the first embodiment, the first operation time interval setting section 242 outputs a first pulse signal ENP0 for setting the operation time interval of the second driving unit 250, when the word line is enabled, that is, when the word line enable/disable signal ACTEN changes from a low level to a high level. The first operation time interval setting section 242 includes the first delay unit 242A configured to delay the supplied word line enable/disable signal ACTEN.

The second operation interval setting section 746 outputs a second pulse signal ENP1 for setting the operation time interval of the second driving unit 250, when the word line is disabled, that is, when the word line enable/disable signal ACTEN changes from a high level to a low level. The second operation time interval setting section 746 includes a second delay unit 746A. A propagation delay circuit in which a logic gate, a resistor, and a capacitor are combined to transfer a signal may be used as the second delay 746A. A delay time interval may be set through a test mode or fuse programming.

The operation control unit 730 further includes a logic operation section 748 configured to logically operate upon the first and second pulse signals ENP0 and ENP1 of the first and second operation time interval setting sections 242 and 746 to generate and output an enable pulse signal ENP. The logic operation section 748 may be implemented as an OR gate.

Hereafter, an operation of the internal negative voltage generation device in accordance with the third embodiment of the present invention is described in detail.

Figure 8:
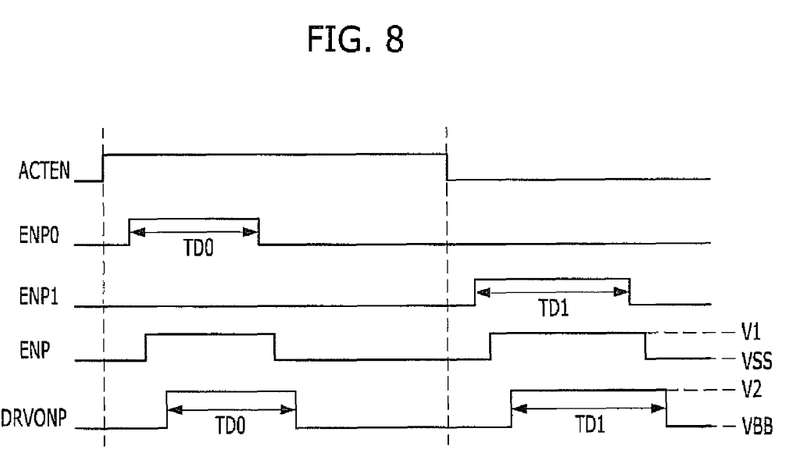
FIG. 8 is a timing diagram explaining an operation of the internal negative voltage generation device in accordance with the third embodiment of the present invention.

FIG. 8 is a timing diagram explaining the operation of the internal negative voltage generation device in accordance with the third embodiment of the present invention.

Referring to FIG. 8, the negative word line driving voltage VBBW is outputted to a word line through the word line driver. Accordingly, data stored in the corresponding memory cell is maintained.

When data is read from or written into the corresponding memory cell, the corresponding word line is enabled. That is, the corresponding word line driver changes the level of the negative word line driving voltage VBBW to the level of a high potential voltage VPP, and then outputs the changed negative word line driving voltage VBBW to the word line.

At this time, the word line enable/disable signal ACTEN is output. The operation control unit 730 is operated in response to the outputted word line enable/disable signal ACTEN. That is, the first operation time interval setting section 242 outputs the first pulse signal ENP0 corresponding to a set time interval, that is, a time interval TD0 in which the second driving unit 250 operates. On the other hand, the output signal ENP1 of the second operation time interval setting section 746 is not output.

Then, the logic operation section 748 receives the output signals ENP0 and ENP1 of the first and second operation interval setting section 242 and logically sums the output signals ENP0 and ENP1 and outputs the enable pulse signal ENP.

The voltage level shifter 244A shifts the voltage level of the enable pulse signal ENP outputted from the logic operation section 748. The buffer 244B buffers the output signal shifted by the voltage level shifter 244A to output an operation control pulse signal DRVONP having a source voltage level V2 for turning on the second driving unit 250.

Accordingly, the second driving unit 250 is operated in response to the outputted operation control pulse signal DRVONP, and stably supplies the negative word line driving voltage VBBW to the word line driver during the initial enable time interval of the word line.

Then, when the word line enable/disable signal ACTEN is not output, the output signal ENP0 of the first operation time interval setting section 242 maintains a low logic level. Only the second operation time interval setting section 746 outputs the second pulse signal ENP1 corresponding to a set time interval, that is, a time interval TD1 in which the second driving unit 250 operates.

The logic operation section 748 receives the output signals ENP0 and ENP1 of the first and second operation time interval setting section 242 and logically sums the output signals ENP0 and ENP1 and outputs an enable pulse signal ENP.

The voltage level shifter 244A shifts the voltage level of the enable pulse signal ENP outputted from the logic operation section 748. The buffer 244B buffers the output signal shifted by the voltage level shifter 244A to output an operation control pulse signal DRVONP having a source voltage level V2 for turning on the second driving unit 250.

Accordingly, the second driving unit 250 is operated in response to the supplied operation control pulse signal DRVONP, and stably supplies the negative word line driving voltage VBBW to the word line driver during the initial time disable interval of the word line.

In accordance with the embodiments of the present invention, the variations of the negative word line driving voltage VBBW, which occur due to the consumption of dynamic power when the word line is enabled or disabled, are minimized/reduced. Therefore, the data maintenance ability of the memory cell is improved.

In accordance with the embodiments of the present invention, the internal negative voltage generation device may additionally drive the negative word line driving voltage (VBBW) terminal to the back-bias voltage during a set time interval, when the level of the negative word line driving voltage changes. Therefore, the variations of the negative word line driving voltage, which occur due to the consumption of dynamic power at the initial stage of the active operation time interval, are minimized to suppress an off leakage current of a memory cell. Therefore, the data maintenance ability of the memory cell is improved.

While the present invention has been described with respect to the specific embodiments thereof, it will be apparent to those skilled in the art that various changes and modifications may be made without departing from the spirit and scope of the present invention as defined by the following claims.

What is claimed is:

1. An internal negative voltage generation device, comprising:
    a first internal negative voltage generation unit configured to generate a first internal negative voltage lower than a ground voltage;
    a second internal negative voltage generation unit configured to generate a second internal negative voltage based on the first internal negative voltage, the second internal negative voltage being higher than the first internal negative voltage and lower than the ground voltage; and
    a driving unit configured to additionally drive a second internal negative voltage terminal to the first internal negative voltage during an initial set time interval of an active operation time interval in response to an operation control pulse signal;
    an operation time interval setting unit configured to set an estimated time interval of operation of the driving unit, and to output a pulse signal corresponding to the estimated time interval; and
    a signal level conversion unit configured to convert the pulse signal into a signal level for the driving unit, and to output the operation control pulse signal.

2. The internal negative voltage generation device of claim 1, wherein the driving unit comprises an transistor coupled between a first internal negative voltage terminal and the second internal negative voltage terminal, and having a gate receiving the operation control pulse signal.

3. An internal negative voltage generation device, comprising:
    a first internal negative voltage generation block configured to generate a first internal negative voltage lower than a ground voltage;
    a second internal negative voltage generation block configured to generate a second internal negative voltage based onto the first internal negative voltage, the second internal negative voltage being higher than the first internal negative voltage and lower than the ground voltage; and a driving unit configured to additionally drive a second internal negative voltage terminal to the first internal negative voltage during an initial set time interval of an enable time interval and during an initial set time interval of a disable time interval in response to an operation control pulse signal;

a first operation time interval setting unit configured to receive an enable signal and to output a first pulse signal during a first time interval;

a second operation interval setting unit configured to receive a disable signal and to output a second pulse signal during a second time interval; and a signal level conversion unit configured to convert one of the first and second pulse signals into a signal level for operating the driving unit, and to output the operation control pulse signal.

4. The internal negative voltage generation device of claim 3, further comprising:

a logic operation unit configured to logically operate upon the first and second pulse signals to output a logically operate signal to the signal level conversion unit.

5. The internal negative voltage generation device of claim 3, wherein the driving unit comprises transistor coupled between a first internal negative voltage terminal and the second internal negative voltage terminal, and having a gate receiving the operation control pulse signal.

6. The internal negative voltage generation device of claim 1, wherein the operation time interval setting unit comprises:

a delay unit configured to delay an enable signal by a delay time interval; and a logic unit configured to perform a logic operation on the enable signal and an output of the delay unit.

7. The internal negative voltage generation device of claim 6, the delay time interval is set through a test mode or fuse programming.

8. The internal negative voltage generation device of claim 1, wherein the signal level conversion unit comprises:

a voltage level shifter configured to shift a voltage level of the pulse signal; and a buffer configured to buffer an output signal of the voltage level shifter to output the operation control pulse signal.

9. The internal negative voltage generation device of claim 3, wherein the first and second time interval is substantially the same as an estimated time interval of operation of the driving unit.

10. The internal negative voltage generation device of claim 3, wherein the first operation time interval setting unit comprises:

a delay unit configured to delay the enable signal by a delay time interval; and a logic unit configured to perform a logic operation on the enable signal and an output of the delay unit.

11. The internal negative voltage generation device of claim 10, the delay time interval is set through a test mode or fuse programming.

12. The internal negative voltage generation device of claim 3, wherein the second operation time interval setting unit comprises:

a delay unit configured to delay the disable signal by a delay time interval; and a logic unit configured to perform a logic operation on the disable signal and an output of the delay unit.

13. The internal negative voltage generation device of claim 12, the delay time interval is set through a test mode or fuse programming.

14. The internal negative voltage generation device of claim 3, wherein the signal level conversion unit comprises:

a voltage level shifter configured to shift a voltage level of one of the first and second pulse signals; and a buffer configured to buffer an output signal of the voltage level shifter to output the operation control pulse signal.

* * * * *